(12) United States Patent
Wang et al.

(10) Patent No.: US 11,695,007 B2
(45) Date of Patent: Jul. 4, 2023

(54) GUARD RING CAPACITOR METHOD AND STRUCTURE

(71) Applicant: TAIWAN SEMICONDUCTOR MANUFACTURING CO., LTD., Hsinchu (TW)

(72) Inventors: Yi-Hsiang Wang, Hsinchu (TW); Szu-Lin Liu, Hsinchu (TW); Jaw-Juinn Horng, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 239 days.

(21) Appl. No.: 17/030,122

(22) Filed: Sep. 23, 2020

(65) Prior Publication Data

US 2021/0305248 A1 Sep. 30, 2021

Related U.S. Application Data

(60) Provisional application No. 63/002,868, filed on Mar. 31, 2020.

(51) Int. Cl.
*H01L 27/092* (2006.01)
*H01L 21/8238* (2006.01)
(Continued)

(52) U.S. Cl.
CPC .. *H01L 27/0921* (2013.01); *H01L 21/823814* (2013.01); *H01L 21/823871* (2013.01);
(Continued)

(58) Field of Classification Search
CPC ......... H01L 27/0921; H01L 21/823814; H01L 21/823871; H01L 23/642; H01L 27/0222;
(Continued)

(56) References Cited

U.S. PATENT DOCUMENTS 8,492,873 B1 * 7/2013 Tan ...................... H01L 21/761
257/532
2014/0306293 A1 10/2014 Baek et al.
(Continued)

FOREIGN PATENT DOCUMENTS

| JP | S6197858 | 5/1986 |
| TW | 201306264 | 2/2013 |
| WO | 2015178976 | 11/2015 |

OTHER PUBLICATIONS

Notice of Allowance dated Jun. 8, 2021 for corresponding case No. TW 11020540470. (pp. 1-4).
(Continued)

*Primary Examiner* — Jung Kim
(74) *Attorney, Agent, or Firm* — Hauptman Ham, LLP

(57) ABSTRACT

A method of biasing a guard ring structure includes biasing a gate of a MOS transistor to a first bias voltage level, biasing first and second S/D regions of the MOS transistor to a power domain voltage level, biasing a gate of the guard ring structure to a second bias voltage level, and biasing first and second heavily doped regions of the guard ring structure to the power domain voltage level. Each of the first and second S/D regions has a first doping type, each of the first and second heavily doped regions has a second doping type different from the first doping type, and each of the first and second S/D regions and the first and second heavily doped regions is positioned in a substrate region having the second doping type.

20 Claims, 6 Drawing Sheets

(51) Int. Cl.
*H03K 17/687* (2006.01)
*H01L 23/64* (2006.01)
*H01L 27/02* (2006.01)

(52) U.S. Cl.
CPC ........ *H01L 23/642* (2013.01); *H01L 27/0222* (2013.01); *H03K 17/6872* (2013.01)

(58) Field of Classification Search
CPC .............. H01L 27/0207; H01L 29/94; H01L 21/823481; H01L 21/823878; H01L 27/0629; H01L 27/0251; H01L 27/088; H03K 17/6872
See application file for complete search history.

(56) References Cited

U.S. PATENT DOCUMENTS

| | | | |
|---|---|---|---|
| 2017/0012040 A1* | 1/2017 | Lu | H01L 21/823456 |
| 2018/0145186 A1 | 5/2018 | Veeramma | |
| 2018/0233377 A1 | 8/2018 | Cheng et al. | |

OTHER PUBLICATIONS

Liu et al., "Complete DFM Model for High-Performance Computing SoCs with Guard Ring and Dummy Fill Effect", University of California, Los Angeles yuandu@ucla.edu, total 4 pages.
Office Action dated Oct. 29, 2021 for corresponding case No. KR 10-2020-0181190. (pp. 1-4).

* cited by examiner

GUARD RING CAPACITOR METHOD AND STRUCTURE

PRIORITY CLAIM

The present application claims the priority of U.S. Provisional Application No. 63/002,868, filed Mar. 31, 2020, which is incorporated herein by reference in its entirety.

BACKGROUND

Integrated circuits (ICs) often include combinations of n-type metal-oxide-semiconductor (NMOS) and p-type metal-oxide-semiconductor (PMOS) transistors arranged to perform various circuit functions. To address potential latch-up behavior based on parasitic bipolar transistors formed by the arrangements, NMOS and PMOS transistor regions are sometimes surrounded by guard rings.

ICs also often include capacitive devices to expand circuit capabilities and enhance performance. One type of capacitive device is a decoupling capacitor (decap) configured to reduce noise within an IC by shunting alternating current (AC) signals to a power supply reference or voltage node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
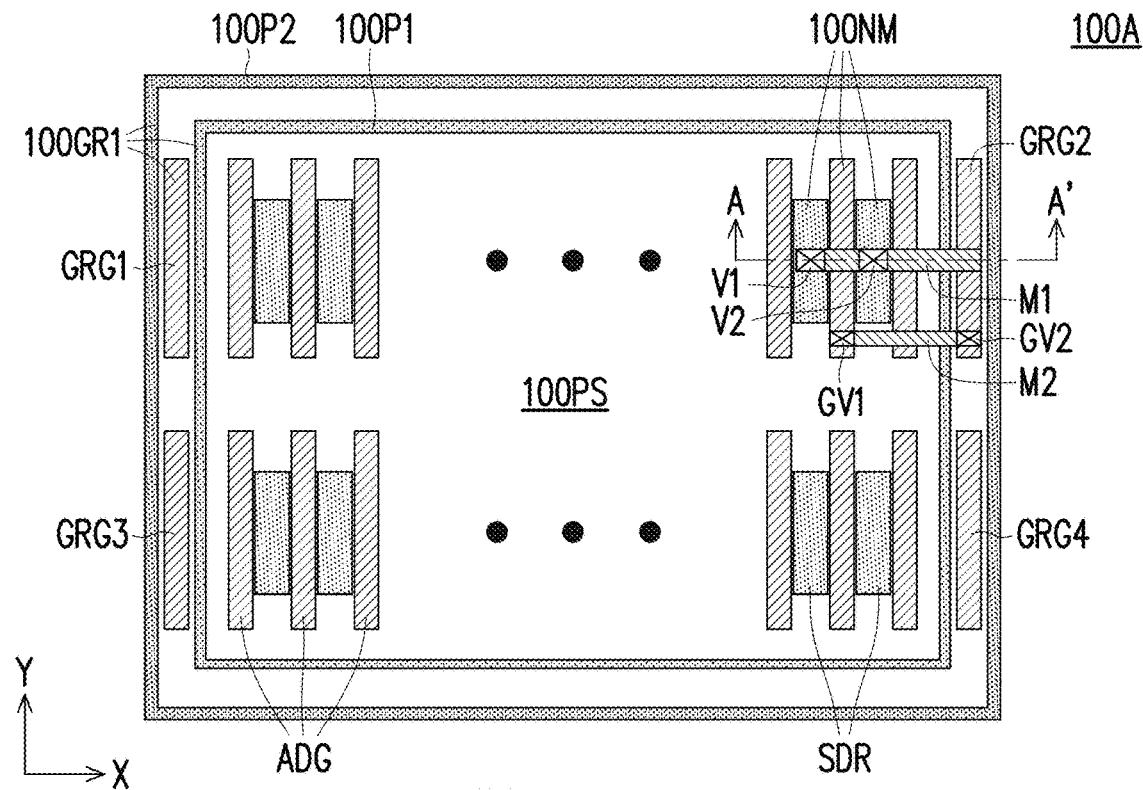
FIGS. 1A and 1B are plan views of IC devices, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a guard ring structure of an IC device includes electrical connections to a gate and adjacent heavily doped regions and is thereby configured as a capacitive device capable of being biased by received voltages. By including the guard ring structure in an IC, e.g., as a decap device, the area required to obtain a given capacitance level is less than the area required in approaches in which a guard ring structure is not configured as a capacitive device.

Figure 1B:
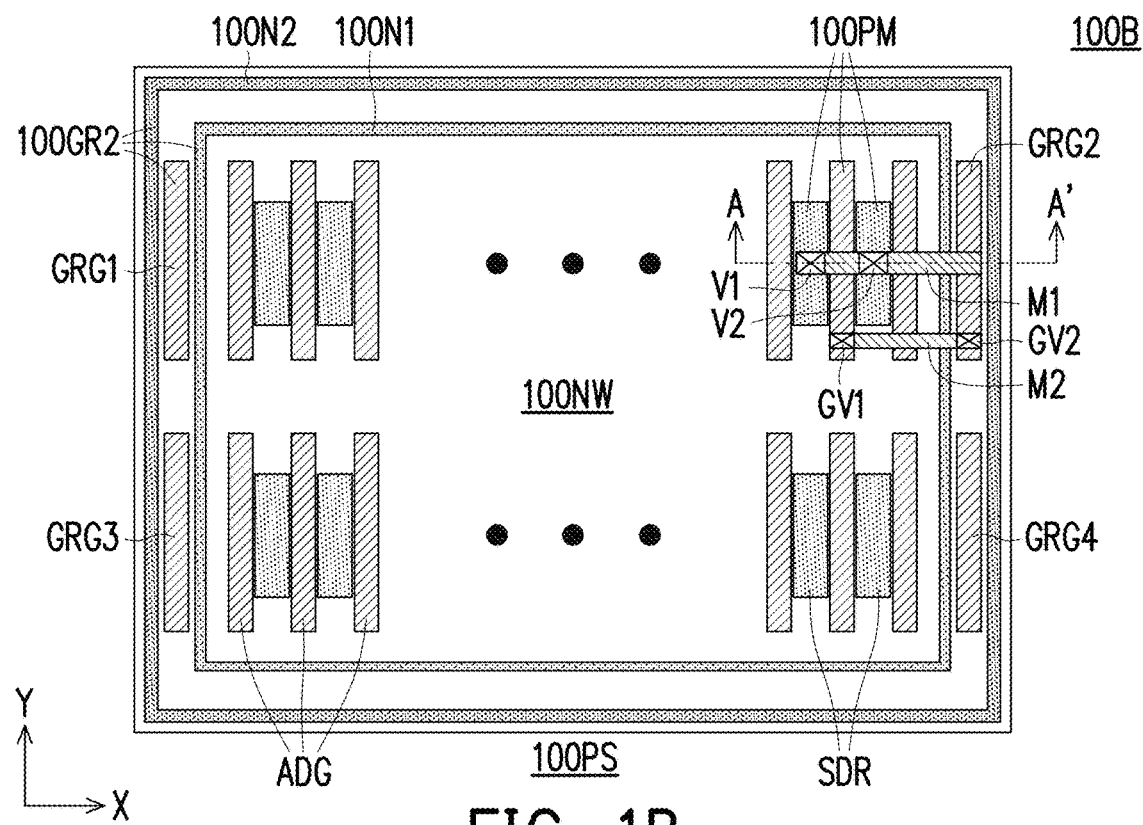
Figure 2:
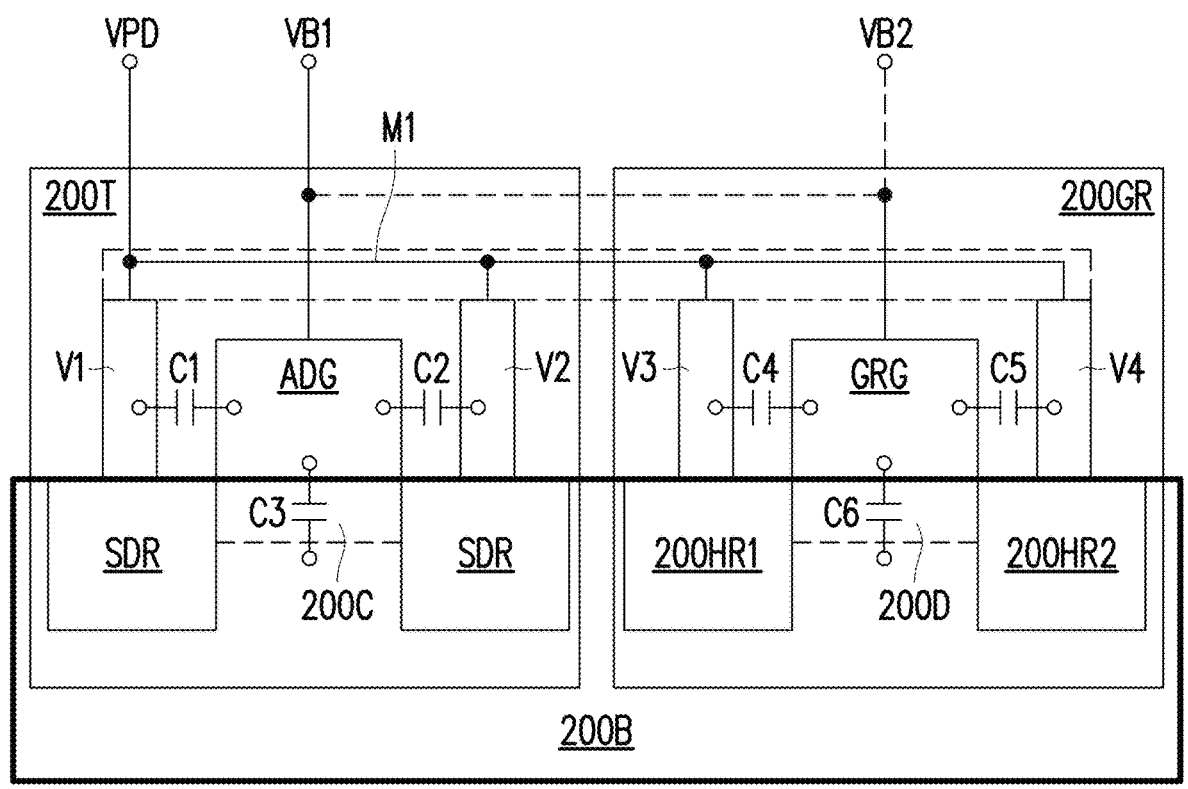
FIG. 2 is a cross-sectional view of an IC device, in accordance with some embodiments.
Figure 2:
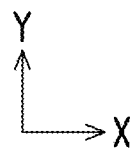

FIGS. 1A and 1B are plan views of respective IC devices 100A and 100B, in accordance with some embodiments. In addition to IC device 100A or 100B, each of FIGS. 1A and 1B also includes an X direction and a Y direction perpendicular to the X direction. Cross-sectional views of each of IC devices 100A and 100B along a line A-A' in a plane defined by the X direction and a Z direction perpendicular to the X and Y directions correspond to an IC device 200 as depicted in FIG. 2 and discussed below. In some embodiments, one or more of IC devices 100A, 100B, or 200 is manufactured in accordance with a method 400 of manufacturing an IC device discussed below with respect to FIGS. 4-5D.

IC device 100A includes a p-type substrate region 100PS, source/drain (S/D) regions SDR (representative instances labeled) positioned in substrate region 100PS, and gates ADG (representative instances labeled) positioned adjacent to S/D regions SDR and overlying substrate region 100PS. A rectangular, heavily doped region 100P1 in substrate region 100PS surrounds S/D regions SDR and gates ADG, a rectangular, heavily doped region 100P2 in substrate region 100PS surrounds heavily doped region 100P1, and gates GRG1-GRG4 are positioned adjacent to and between heavily doped regions 100P1 and 100P2 and overlying substrate region 100PS.

A first element is considered to overlie or underlie a second element based on at least a portion of the first element being aligned in the positive or negative Z direction, respectively, with at least a portion of the second element.

Gates ADG and adjacent pairs of S/D regions correspond to NMOS transistors 100NM (a representative instance labeled), and gates GRG1-GRG4 and heavily doped regions 100P1 and 100P2 are thereby configured as a guard ring structure 100GR1 surrounding NMOS transistors 100NM.

IC device 100B includes an n-type substrate region 100NW positioned in substrate region 100PS, source/drain (S/D) regions SDR (representative instances labeled) positioned in substrate region 100NW, and gates ADG (representative instances labeled) positioned adjacent to S/D regions SDR and overlying substrate region 100NW. A rectangular, heavily doped region 100N1 in substrate region 100NW surrounds S/D regions SDR and gates ADG, a rectangular, heavily doped region 100N2 in substrate region 100NW surrounds heavily doped region 100N1, and gates GRG1-GRG4 are positioned adjacent to and between heavily doped regions 100N1 and 100N2 and overlying substrate region 100NW.

Gates ADG and adjacent pairs of S/D regions correspond to PMOS transistors 100PM (a representative instance labeled), and gates GRG1-GRG4 and heavily doped regions 100N1 and 100N2 are thereby configured as a guard ring structure 100GR2 surrounding PMOS transistors 100PM.

FIGS. 1A and 1B are simplified for clarity. In various embodiments, one or both of IC devices 100A and 100B includes one or more features, e.g., vias, conductive segments, isolation structures, or the like, in addition to the features depicted in FIGS. 1A and 1B. Accordingly, various NMOS transistors 100NM and PMOS transistors 100PM include elements, e.g., conductive segments overlying S/D regions SDR and gates ADG, that are not depicted in FIGS. 1A and 1B for clarity.

Substrate region 100PS is a portion of a semiconductor wafer suitable for forming one or more IC devices. In some embodiments, substrate region 100PS includes p-type silicon including one or more acceptor dopants, e.g., boron (B) or aluminum (Al). Substrate region 100NW, also referred to as an n-well 100NW in some embodiments, is a portion of the semiconductor wafer positioned within substrate region 100PS. In some embodiments, substrate region 100NW includes n-type silicon (Si) including one or more donor dopants, e.g., phosphorous (P) or arsenic (As).

S/D regions SDR are volumes within substrate regions 100PS and 100NW in which a given S/D region SDR has a doping type opposite that of the substrate region 100PS or 100NW in which the given S/D region SDR is positioned. S/D regions SDR have one or more doping concentration levels significantly greater than one or more doping concentration levels of substrate regions 100PS and 100NW, and thereby a lower resistance level than that of the corresponding substrate region 100PS or 100NW. In some embodiments, substrate regions 100PS and 100NW are referred to as lightly doped regions 100PS and 100NW, and S/D regions SDR are referred to as heavily doped regions SDR. In some embodiments, each of substrate regions 100PS and 100NW has a doping concentration level below about $1*10^{16}$ per cubic centimeter (cm$^{-3}$) and each of S/D regions SDR has a doping concentration level of about $1*10^{16}$ per cubic centimeter cm$^{-3}$ or greater.

In various embodiments, one or more of S/D regions includes one or more materials different from one or more materials of substrate regions 100PS and 100NW. In various embodiments, one or more of S/D regions SDR includes one or more of Si, SiGe, SiC, B, P, As, Ga, or another material suitable for having a low resistance level. In some embodiments, one or more of S/D regions SDR includes one or more epitaxial layers.

Heavily doped regions 100P1 and 100P2 have p-type doping and one or more doping concentration levels significantly greater than the doping concentration level of substrate region 100PS, and thereby a lower resistance level than that of substrate region 100PS. In some embodiments, each of heavily doped regions 100P1 and 100P2 has a doping concentration level of about $1*10^{16}$ per cubic centimeter cm$^{-3}$ or greater.

Heavily doped regions 100N1 and 100N2 have n-type doping and one or more doping concentration levels significantly greater than the doping concentration level of substrate region 100NW, and thereby a lower resistance level than that of substrate region 100NW. In some embodiments, each of heavily doped regions 100N1 and 100N2 has a doping concentration level of about $1*10^{16}$ per cubic centimeter cm$^{-3}$ or greater.

A gate structure, e.g., a gate ADG or GRG1-GRG4, is an IC structure including a gate electrode (not shown). A gate electrode is a volume including one or more conductive materials at least partially surrounded by one or more dielectric layers (not shown) including one or more dielectric materials configured to electrically isolate the one or more conductive materials from overlying, underlying, and/or adjacent structures, e.g., substrate region 100PS or 100NW. In some embodiments, a gate ADG or GRG1-GRG4 is referred to as a gate electrode ADG or GRG1-GRG4.

Conductive materials include one or more of polysilicon, copper (Cu), aluminum (Al), tungsten (W), cobalt (Co), ruthenium (Ru), or one or more other metals, and/or one or more other suitable materials. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material.

In the embodiments depicted in FIGS. 1A and 1B, NMOS transistors 100NM and PMOS transistors 100PM are arranged in two rows, each row including a plurality of transistors. In various embodiments, one or both of NMOS transistors 100NM and PMOS transistors 100PM is arranged in a single row or more than two rows, and one or more rows includes a single transistor 100NM or 100PM. In some embodiments, one or both of NMOS transistors 100NM and PMOS transistors 100PM is a single transistor.

In some embodiments, one or more of NMOS transistors 100NM is configured as a dummy transistor, e.g., by including an electrical connection (not shown) between the corresponding gate ADG and a power supply reference source, e.g., a power supply configured to provide a voltage VSS or a ground, (not shown) and/or one or more of PMOS transistors 100PM is configured as a dummy transistor, e.g., by including an electrical connection (not shown) between the corresponding gate ADG and a power supply source, e.g., a power supply configured to provide a voltage VDD, (not shown).

As discussed below, IC device 100A includes at least one NMOS transistor configured as a first capacitive device and guard ring structure 100GR1 configured as a second capacitive device, and IC device 100B includes at least one PMOS transistor configured as the first capacitive device and guard ring structure 100GR2 configured as the second capacitive device.

FIG. 1A depicts a single instance of NMOS transistor 100NM configured as the first capacitive device adjacent to guard ring structure 100GR1 configured as the second capacitive device. NMOS transistor 100NM includes a via V1 overlying and electrically connected to a first S/D region SDR, a via V2 overlying and electrically connected to a second S/D region SDR, and a conductive segment M1 overlying and electrically connected to each of vias V1 and V2. NMOS transistor 100NM also includes a via GV1 overlying and electrically connected to gate ADG, and a conductive segment M2 overlying and electrically connected to via GV1.

Each of a via, e.g., via V1 or V2, and a conductive segment, e.g., conductive segment M1, is a volume including one or more conductive materials and configured to provide an electrical connection between two or more adjacent, overlying, and/or underlying IC features.

By including gate ADG electrically connected to a first bias voltage source (not shown) through via VG1 and conductive segment M2, and each of the adjacent pairs of S/D regions SDR electrically connected to a power domain voltage source, i.e., one of the power supply reference source or power supply source, through vias V1 and V2 and conductive segment M1, the instance of NMOS transistor 100NM is configured as the first capacitive device, as further discussed below with respect to FIG. 2.

Guard ring structure 100GR1 includes heavily doped regions 100P1 and 100P2 electrically connected to conductive segment M1 and the first bias voltage source through vias (not shown in FIGS. 1A and 1B), and gate GRG2 electrically connected to conductive segment M2 and the power domain voltage source through a via GV2, and is thereby configured as the second capacitive device, as further discussed below with respect to FIG. 2.

In various embodiments, guard ring structure 100GR1 includes gate GRG2 electrically connected to a conductive segment (not shown) other than conductive segment M1 through via GV2, and is thereby either otherwise electrically connected to the first bias voltage source or electrically connected to a second bias voltage source. In some embodiments, guard ring structure 100GR1 includes heavily doped regions 100P1 and 100P2 electrically connected to one or more conductive segments (not shown) other than conductive segment M2 through vias V1 and V2, and is thereby otherwise electrically connected to the power domain voltage source.

FIG. 1B depicts a single instance of PMOS transistor 100PM configured as the first capacitive device adjacent to guard ring structure 100GR2 configured as the second capacitive device. The instance of PMOS transistor 100PM is configured analogously to the instance of NMOS transistor 100NM, and guard ring structure 100GR2 is configured analogously to guard ring 100GR1, each discussed above, so a detailed description is not repeated.

The depictions in FIGS. 1A and 1B are non-limiting examples in which a single instance of a transistor, NMOS transistor 100NM or PMOS transistor 100PM, adjacent to and surrounded by a guard ring structure, guard ring structure 100GR1 or 100GR2, is configured as the first capacitive device. In various embodiments, the first capacitive device includes multiple transistors, one or more transistors non-adjacent to the guard ring structure, and/or one or more transistors not surrounded by the guard ring structure.

In the embodiments depicted in FIGS. 1A and 1B, each of guard ring structures 100GR1 and 100GR2 includes an electrical connection from heavily doped regions 100P1 and 100P2 or 100N1 and 100N2 to a power domain voltage source through conductive segment M1, and an electrical connection from gate GRG2 to a first or second bias voltage source through conductive segment M2. In various embodiments, one or both of guard ring structures 100GR1 or 100GR2 includes one or more conductive segments (not shown) in addition to conductive segment M1 through which heavily doped regions 100P1 and 100P2 or 100N1 and 100N2 are electrically connected to the power domain voltage source, and/or in addition to conductive segment M2 through which one or more of gates GRG1-GRG4 is electrically connected to the first or second bias voltage source.

In the embodiments depicted in FIGS. 1A and 1B, gates GRG1 and GRG2 are aligned with the first row of transistors 100NM or 100PM in the X direction, gates GRG3 and GRG4 are aligned with the second row of transistors 100NM or 100PM in the X direction, and the corresponding guard ring structure 100GR1 or 100GR2 is thereby configured as the second capacitive device having a capacitance value based on each of gates GRG1-GRG4. In some embodiments, one or both of guard ring structures 100GR1 or 100GR2 includes a subset of gates, e.g., gates GRG1-GRG4, electrically connected to the first or second bias voltage source, and the corresponding guard ring structure 100GR1 or 100GR2 is thereby configured as the second capacitive device having the capacitance value based on the subset of gates.

In various embodiments, one or both of guard ring structures 100GR1 or 100GR2 includes fewer or greater than four gates otherwise arranged and electrically connected such that the corresponding guard ring structure 100GR1 or 100GR2 is configured as the second capacitive device having the capacitance value based on the gates. In some embodiments, one or both of guard ring structures 100GR1 or 100GR2 includes one or more gates, e.g., one or more of gates GRG1-GRG4, extending in the Y direction across two or more rows of transistors, e.g., transistors 100NM or 100PM, and the corresponding guard ring structure 100GR1 or 100GR2 is configured as the second capacitive device having the capacitance value based on the one or more gates.

FIG. 2 is a cross-sectional view of IC device 200, in accordance with some embodiments. In addition to IC device 200, FIG. 2 also includes the X and Z directions, each discussed above with respect to FIGS. 1A and 1B. IC device 200 depicts a cross-sectional view of either IC device 100A or IC device 100B along the X-Z plane and corresponding to line A-A' discussed above with respect to FIGS. 1A and 1B, and as further discussed below.

IC device 200 includes a substrate region 200B, a transistor 200T positioned in substrate region 200B, a guard ring structure 200GR positioned in substrate region 200B, and, in some embodiments, conductive segment M1 discussed above with respect to FIGS. 1A and 1B. Transistor 200T includes S/D regions SDR, gate ADG, and vias V1 and V2, discussed above with respect to FIGS. 1A and 1B, and guard ring structure 200GR includes heavily doped regions 200HR1 and 200HR2, a gate GRG, and vias V3 and V4.

In embodiments in which IC device 200 corresponds to IC device 100A, discussed above with respect to FIG. 1A, transistor 200T corresponds to the instance of transistor 100NM including S/D regions SDR and gate ADG configured as the first capacitive device, and guard ring structure 200GR corresponds to guard ring structure 100GR1 including heavily doped regions 100P1 and 100P2 and gate GRG2 configured as the second capacitive device.

In embodiments in which IC device 200 corresponds to IC device 100B, discussed above with respect to FIG. 1B, transistor 200T corresponds to the instance of transistor 100PM including S/D regions SDR and gate ADG configured as the first capacitive device, and guard ring structure 200GR corresponds to guard ring structure 100GR2 including heavily doped regions 100N1 and 100N2 and gate GRG2 configured as the second capacitive device.

Transistor 200T includes via V1 electrically connected to one of S/D regions SDR and via V2 electrically connected to the other of S/D regions SDR. Each of vias V1 and V2 is configured, e.g., electrically connected though conductive segment M1, to receive a power domain voltage level VPD from a power domain voltage source, i.e., a power supply voltage level received from a power supply voltage source or a power supply reference voltage level received from a power supply reference voltage source. Transistor 200T also includes via GV1 (not shown in FIG. 2) electrically connected to gate ADG and is configured, e.g., through conductive segment M2 (not shown in FIG. 2), to receive a first bias voltage level VB1 from the first bias voltage source as discussed above with respect to FIGS. 1A and 1B.

Gate ADG is separated from vias V1 and V2 by one or more dielectric layers (not shown) and overlies substrate region 200B. A capacitance component C1 corresponds to via V1 and gate ADG separated by the one or more dielectric layers, a capacitance component C2 corresponds to via V2 and gate ADG separated by the one or more dielectric layers, and a capacitance component C3 corresponds to gate ADG overlying substrate region 200B. Transistor 200T is thereby configured as the first capacitive device having a first capacitance value including a sum of capacitance components C1-C3. In some embodiments, the first capacitance value further includes one or more components in addition to capacitance components C1-C3, e.g., one or more parasitic capacitance components.

Guard ring structure 200GR includes via V3 electrically connected to heavily doped region 100HR1 and via V4 electrically connected to heavily doped region 100HR2. Each of vias V3 and V4 is configured, e.g., electrically connected though conductive segment M1, to receive the power domain voltage level VPD from the power domain voltage source. Guard ring structure 200GR also includes via GV2 (not shown in FIG. 2) electrically connected to gate GRG and is configured, e.g., through conductive segment M2 (not shown in FIG. 2), to receive either the first bias voltage level VB1 from the first bias voltage source or a second bias voltage level VB2 from the second bias voltage source as discussed above with respect to FIGS. 1A and 1B.

Gate GRG is separated from vias V3 and V4 by the one or more dielectric layers and overlies substrate region 200B. A capacitance component C4 corresponds to via V3 and gate GRG separated by the one or more dielectric layers, a capacitance component C5 corresponds to via V4 and gate GRG separated by the one or more dielectric layers, and a capacitance component C6 corresponds to gate GRG overlying substrate region 200B. Guard ring structure 200GR is thereby configured as the second capacitive device having a second capacitance value including a sum of capacitance components C4-C6. In some embodiments, the second capacitance value further includes one or more components in addition to capacitance components C4-C6, e.g., one or more parasitic capacitance components.

Values of capacitance components C1-C6 are based on the physical arrangements of the relevant IC features and, in operation, on values of power domain voltage level VPD, first bias voltage level VB1, and second bias voltage level VB2, as discussed below.

Each of capacitance components C1, C2, C4, and C5 has a value based on a distance in the X direction (not labeled) between the corresponding via and gate, surface areas (not shown) of the corresponding via and gate perpendicular to and separated by the distance, and one or more dielectric constants corresponding to the one or more dielectric layers between the corresponding surface areas.

Capacitance component C3 has a value based on a channel region 200C in substrate region 200B. Channel region 200C has a surface area in the X-Y plane (not shown) based on sizes and relative positioning of gate ADG and S/D regions SDR. In operation, channel region 200C has a depth in the Z direction based on values of power domain voltage level VPD and first bias voltage level VB1.

In some embodiments in which IC device 200 corresponds to IC device 100A, transistor 200T is configured to receive power domain voltage level VPD at S/D regions SDR through vias V1 and V2 having the power supply reference voltage level, e.g., ground, and the value of capacitance component C3 is based on the composition and depth of channel region 200C in p-type substrate region 100PS as determined by first bias voltage level VB1 received at gate ADG.

In some such embodiments, transistor 200T is configured to operate in an inversion mode by receiving first bias voltage level VB1 above the power supply reference voltage level such that, in operation, channel region 200C corresponds to a conduction channel including negatively charged carriers, i.e., electrons, and having a depth based on a difference between first bias voltage level VB1 and the power supply reference voltage level. In some such embodiments, transistor 200T is configured to operate in an accumulation mode by receiving first bias voltage level VB1 below the power supply reference voltage level such that, in operation, channel region 200C corresponds to a conduction channel including positively charged carriers, i.e., holes, and having a depth based on a difference between first bias voltage level VB1 and the power supply reference voltage level.

In some embodiments in which IC device 200 corresponds to IC device 100B, transistor 200T is configured to receive power domain voltage level VPD at S/D regions SDR through vias V1 and V2 having the power supply voltage level, and the value of capacitance component C3 is based on the composition and depth of channel region 200C in n-type substrate region 100NW as determined by first bias voltage level VB1 received at gate ADG.

In some such embodiments, transistor 200T is configured to operate in the inversion mode by receiving first bias voltage level VB1 below the power supply voltage level such that, in operation, channel region 200C corresponds to a conduction channel including positively charged carriers and having a depth based on a difference between first bias voltage level VB1 and the power supply voltage level. In some such embodiments, transistor 200T is configured to operate in the accumulation mode by receiving first bias voltage level VB1 above the power supply voltage level such that, in operation, channel region 200C corresponds to a conduction channel including negatively charged carriers and having a depth based on a difference between first bias voltage level VB1 and the power supply voltage level.

In each of the embodiments discussed above, capacitance component C3 thereby has a value in operation based on the depth of channel region 200C and charged carrier polarity as determined by first bias voltage level VB1 relative to power domain voltage level VPD.

Capacitance component C6 has a value based on a depletion region 200D in substrate region 200B. Depletion region 200D has a surface area in the X-Y plane (not shown) based on sizes and relative positioning of gate GRG and heavily doped regions 200HR1 and 200HR2. In operation, depletion region 200D has a depth in the Z direction based on values of power domain voltage level VPD and second bias voltage level VB2.

In some embodiments in which IC device 200 corresponds to IC device 100A, guard ring structure 200GR is configured to receive power domain voltage level VPD at heavily doped regions 200HR1 and 200HR2 through vias V3 and V4 having the power supply reference voltage level simultaneously with transistor 200T receiving power domain voltage level VPD having the power supply reference voltage level as discussed above. The value of capacitance component C6 is thereby based on the composition and depth of depletion region 200D in p-type substrate region 100PS as determined by second bias voltage level VB2 received at gate GRG.

In some such embodiments, guard ring structure 200GR is configured to operate in a depletion mode by receiving second bias voltage level VB2 above the power supply reference voltage level such that, in operation, depletion region 200D includes negatively charged carriers having a depth based on a difference between second bias voltage level VB2 and the power supply reference voltage level. In some such embodiments, guard ring structure 200GR is configured to operate in the depletion mode by receiving second bias voltage level VB2 below the power supply reference voltage level such that, in operation, depletion region 200D includes positively charged carriers having a depth based on a difference between second bias voltage level VB2 and the power supply reference voltage level.

In some embodiments in which IC device 200 corresponds to IC device 100B, guard ring structure 200GR is configured to receive power domain voltage level VPD at heavily doped regions 200HR1 and 200HR2 through vias V3 and V4 having the power supply voltage level simultaneously with transistor 200T receiving power domain voltage level VPD having the power supply voltage level as discussed above. The value of capacitance component C6 is thereby based on the composition and depth of depletion region 200D in n-type substrate region 100NW as determined by second bias voltage level VB2 received at gate GRG.

In some such embodiments, guard ring structure 200GR is configured to operate in the depletion mode by receiving second bias voltage level VB2 below the power supply voltage level such that, in operation, depletion region 200D includes positively charged carriers having a depth based on a difference between second bias voltage level VB2 and the power supply voltage level. In some such embodiments, guard ring structure 200GR is configured to operate in the depletion mode by receiving second bias voltage level VB2 above the power supply voltage level such that, in operation, depletion region 200D includes negative charge carriers having a depth based on a difference between second bias voltage level VB2 and the power supply voltage level.

In each of the embodiments discussed above, capacitance component C6 thereby has a value in operation based on the depth of depletion region 200D and charged carrier polarity as determined by second bias voltage level VB2 relative to power domain voltage level VPD.

IC device 200 is configured as discussed above to include transistor 200T having the first capacitance value based in part on power domain voltage level VPD and first bias voltage level VB1, and guard ring structure 200GR having the second capacitance value based in part on power domain voltage level VPD and second bias voltage level VB2. In some embodiments, first and second bias voltage levels VB1 and VB2 are a same bias voltage level, and IC device 200 is thereby configured to include each of transistor 200T having the first capacitance value and guard ring structure 200GR having the second capacitance value based in part on power domain voltage level VPD and the same bias voltage level. In some embodiments, IC device 200 is thereby configured to include each of transistors 200T and guard ring structure 200GR as components of a decap device.

The embodiment depicted in FIG. 2 is a non-limiting example provided for the purpose of illustration. In some embodiments, transistor 200T is one transistor of a plurality of similarly configured transistors, and IC device 200 is thereby configured to have a cumulative first capacitance value based on a sum of first capacitance values of each transistor of the plurality of transistors. In some embodiments, gate GRG is one gate of a plurality of similarly configured gates of guard ring structure 200GR, e.g., gates GRG1-GRG4 discussed above with respect to FIGS. 1A and 1B, and IC device 200 is thereby configured to have a cumulative second capacitance value based on a sum of second capacitance values of each gate of the plurality of gates. In some embodiments, guard ring structure 200GR is one guard ring structure of a plurality of similarly configured guard ring structures (not shown), and IC device 200 is thereby configured to have a cumulative second capacitance value based on a sum of second capacitance values of each guard ring structure of the plurality of guard ring structures.

As discussed above, IC device 200 thereby includes guard ring structure 200GR configured as a capacitive device capable of being biased by received voltages. By including guard ring structure 200GR in an IC, e.g., as a decap device, the area required to obtain a given capacitance level is less than the area required in approaches in which a guard ring structure is not configured as a capacitive device.

In some embodiments in which transistor 200T is configured to operate in the inversion mode, an overall capacitance density, e.g., femtofarads (fF) per square micrometer ($\mu m^2$), of IC device 200 is increased by greater than 0.5% compared to approaches in which a guard ring structure is not configured as a capacitive device. In some embodiments in which transistor 200T is configured to operate in the accumulation mode, an overall capacitance density of IC device 200 is increased by about a factor of five compared to approaches in which a guard ring structure is not configured as a capacitive device.

Figure 3:
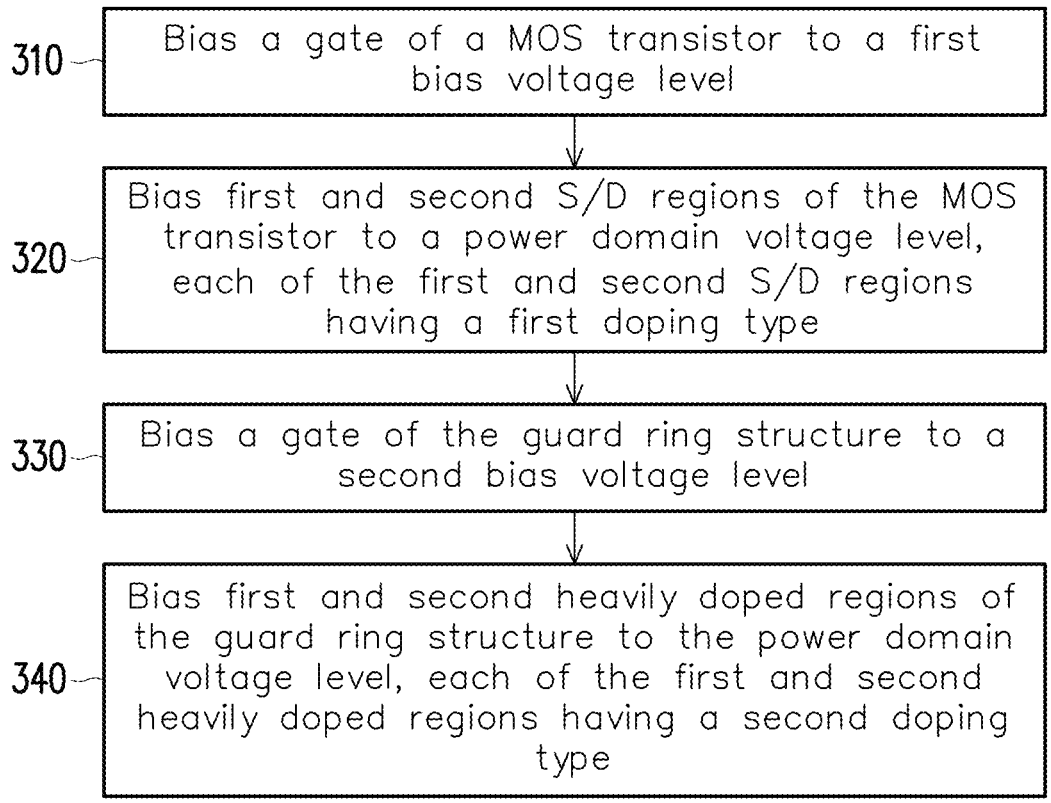
FIG. 3 is a flowchart of a method of biasing a guard ring structure, in accordance with some embodiments.

FIG. 3 is a flowchart of a method 300 of biasing a guard ring structure, in accordance with one or more embodiments. Method 300 is usable with an IC device, e.g., IC device 100A, 100B, or 200 discussed above with respect to FIGS. 1A-2.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, during, and/or after the operations depicted in FIG. 3. In some embodiments, the operations of method 300 are a subset of a method of operating an IC, e.g., a processor, logic, memory, or signal processing circuit, or the like.

At operation 310, a gate of a MOS transistor is biased to a first bias voltage level. In various embodiments, biasing the gate of the MOS transistor includes biasing the gate of the MOS transistor to the first bias voltage level above or below a ground voltage level, or to the first bias voltage level above or below a power supply voltage level.

In some embodiments, biasing the gate of the MOS transistor to the first bias voltage level includes biasing gate ADG of transistor 200T to first bias voltage level VB1 discussed above with respect to FIG. 2.

In some embodiments, the MOS transistor is one MOS transistor of a plurality of MOS transistors, e.g., two or more of NMOS transistors 100NM discussed above with respect to FIG. 1A or two or more of PMOS transistors 100PM discussed above with respect to FIG. 1B, and biasing the gate of the MOS transistor includes biasing the corresponding gates of each MOS transistor of the plurality of MOS transistors.

At operation 320, first and second S/D regions of the MOS transistor are biased to a power domain voltage level, each of the first and second S/D regions having a first doping type. Biasing the first and second S/D regions having the first doping type includes the first and second S/D regions being positioned in a substrate region having a second doping type different from the first doping type.

In some embodiments, biasing the first and second S/D regions of the MOS transistor includes biasing S/D regions SDR of NMOS transistor 100NM having n-type doping positioned in substrate region 100PS, discussed above with respect to FIG. 1A. In some embodiments, biasing the first and second S/D regions of the MOS transistor includes biasing S/D regions SDR of PMOS transistor 100PM having p-type doping positioned in substrate region 100NW, discussed above with respect to FIG. 1B.

In various embodiments, biasing the first and second S/D regions of the MOS transistor to the power domain voltage level includes biasing the first and second S/D regions of the MOS transistor to the ground voltage level or to the power supply voltage level. In some embodiments, biasing the first and second S/D regions of the MOS transistor to the power domain voltage level includes biasing S/D regions SDR of transistor 200T to power domain voltage level VPD discussed above with respect to FIG. 2.

In various embodiments, biasing the first and second S/D regions to the power domain voltage level includes the first bias voltage level relative to the power domain voltage level causing the MOS transistor to operate in an inversion mode or in an accumulation mode, thereby obtaining a first capacitance value based on a conduction channel generated by the first bias voltage level relative to the power domain voltage level. In some embodiments, obtaining the first capacitance value based on the conduction channel includes obtaining capacitance component C3 based on channel region 200C discussed above with respect to FIG. 2.

In some embodiments, causing the MOS transistor to operate in the inversion mode includes the first and second S/D regions being the n-type, the power domain voltage level being the power supply reference, e.g., ground, voltage level, and the first bias voltage level being above the power supply reference voltage level. In some embodiments, causing the MOS transistor to operate in the inversion mode includes the first and second S/D regions being the p-type, the power domain voltage level being the power supply voltage level, and the first bias voltage level being below the power supply voltage level.

In some embodiments, causing the MOS transistor to operate in the accumulation mode includes the first and second S/D regions being the n-type, the power domain voltage level being the power supply reference voltage level, and the first bias voltage level being below the power supply reference voltage level. In some embodiments, causing the MOS transistor to operate in the accumulation mode includes the first and second S/D regions being the p-type, the power domain voltage level being the power supply voltage level, and the first bias voltage level being above the power supply voltage level.

In some embodiments, the MOS transistor is one MOS transistor of a plurality of MOS transistors, e.g., two or more of NMOS transistors 100NM discussed above with respect to FIG. 1A or two or more of PMOS transistors 100PM discussed above with respect to FIG. 1B, and biasing the first and second S/D regions of the MOS transistor includes biasing the corresponding first and second S/D regions of each MOS transistor of the plurality of MOS transistors.

At operation 330, a gate of the guard ring structure is biased to a second bias voltage level. In various embodiments, biasing the gate of the guard ring structure includes biasing the gate of the guard ring structure to the second bias voltage level above or below the ground voltage level, or to the second bias voltage level above or below the power supply voltage level. In some embodiments, the first bias voltage level and the second bias voltage level are a same bias voltage level.

In some embodiments, biasing the gate of the guard ring structure to the second bias voltage level includes biasing gate GRG of guard ring structure 200GR to second bias voltage level VB2 discussed above with respect to FIG. 2.

In some embodiments, the gate of the guard ring structure is a first gate of a plurality of gates of the guard ring structure, and biasing the gate of the guard ring structure to the second bias voltage level includes biasing the plurality of gates of the guard ring structure to the second bias voltage level. In some embodiments, biasing the plurality of gates of the guard ring structure to the second bias voltage level includes biasing gates GRG1-GRG4 of guard ring structure 100GR1 discussed above with respect to FIG. 1A or guard ring structure 100GR2 discussed above with respect to FIG. 1B.

In some embodiments, the guard ring structure is a first guard ring structure of a plurality of guard ring structures, and biasing the gate of the guard ring structure includes biasing corresponding gates of each guard ring structure of the plurality of guard ring structures.

At operation 340, first and second heavily doped regions of the guard ring structure are biased to the power domain voltage level, each of the first and second heavily doped regions having the second doping type. Biasing the first and second heavily doped regions having the second doping type includes the first and second heavily doped regions being positioned in the substrate region having the second doping type.

In some embodiments, biasing the first and second heavily doped regions of the guard ring structure includes biasing heavily doped regions 100P1 and 100P2 of guard ring structure 100GR1 having p-type doping positioned in substrate region 100PS, discussed above with respect to FIG. 1A. In some embodiments, biasing the first and second heavily doped regions of the guard ring structure includes biasing heavily doped regions 100N1 and 100N2 of guard ring structure 100GR2 having n-type doping positioned in substrate region 100NW, discussed above with respect to FIG. 1B.

In some embodiments, biasing the first and second heavily doped regions of the guard ring structure to the power domain voltage level includes biasing at least one of the first or second heavily doped regions surrounding the MOS transistor.

In various embodiments, biasing the first and second heavily doped regions of the guard ring structure to the power domain voltage level includes biasing the first and second heavily doped regions of the guard ring structure to the ground voltage level or to the power supply voltage level.

Biasing the first and second heavily doped regions to the power domain voltage level includes the second bias voltage level relative to the power domain voltage level causing the guard ring structure to operate in a depletion mode, thereby obtaining a second capacitance value based on a depletion region generated by the second bias voltage level relative to the power domain voltage level. In some embodiments, obtaining the second capacitance value based on the depletion region includes obtaining capacitance component C6 based on depletion region 200D discussed above with respect to FIG. 2.

In various embodiments, causing the guard ring structure to operate in the depletion mode includes the first and second heavily doped regions being the p-type, the power domain voltage level being the power supply reference voltage level, and the second bias voltage level being either above the power supply reference voltage level to generate the depletion region including negatively charged carriers or below the power supply reference voltage level to generate the depletion region including positively charged carriers.

In various embodiments, causing the guard ring structure to operate in the depletion mode includes the first and second heavily doped regions being the n-type, the power domain voltage level being the power supply voltage level, and the second bias voltage level being either below the power supply voltage level to generate the depletion region including positively charged carriers or above the power supply voltage level to generate the depletion region including negatively charged carriers.

In various embodiments, causing the guard ring structure to operate in the depletion mode includes simultaneously causing the MOS transistor to operate in one of the inversion or accumulation modes at operation 320. In some embodiments, causing the guard ring structure to operate in the depletion mode while causing the MOS transistor to operate in one of the inversion or accumulation modes is part of a decap function of an IC circuit operation, the IC circuit including the MOS transistor and the guard ring structure.

In some embodiments, the guard ring structure is a first guard ring structure of a plurality of guard ring structures, and biasing the first and second heavily doped regions of the guard ring structure includes biasing corresponding first and second heavily doped regions of each guard ring structure of the plurality of guard ring structures.

By executing some or all of the operations of method 300, a guard ring structure of an IC device is biased to have a second capacitance value capable of being added to a first capacitance value of a MOS transistor without increasing an area requirement of the IC device, thereby obtaining the benefits discussed above with respect to IC devices 100A, 100B, and 200.

Figure 4:
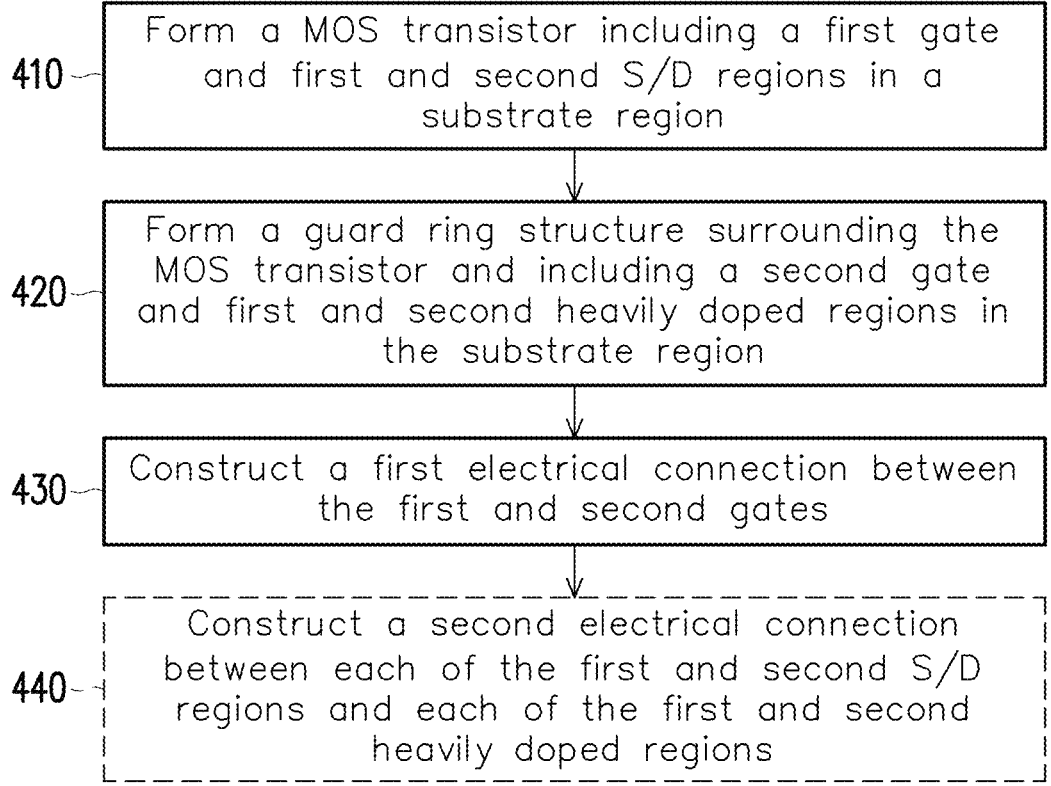
FIG. 4 is a flowchart of a method of manufacturing an IC device, in accordance with some embodiments.

FIG. 4 is a flowchart of method 400 of manufacturing an IC device, e.g., IC device 100A, 100B, or 200 discussed above with respect to FIGS. 1A-2, in accordance with some embodiments. FIGS. 5A-5D are plan-view diagrams of an embodiment of IC device 200 including guard ring structure 200GR, illustrating various manufacturing procedures corresponding to the operations of method 400, in accordance with some embodiments.

The sequence in which the operations of method 400 are depicted in FIG. 4 is for illustration only; the operations of method 400 are capable of being executed simultaneously or in sequences that differ from that depicted in FIG. 4. In some embodiments, operations in addition to those depicted in FIG. 4 are performed before, between, during, and/or after the operations depicted in FIG. 4.

In various embodiments, one or more operations of method 400 are executed using various fabrication tools, e.g., one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed below.

At operation 410, a MOS transistor including a first gate and first and second S/D regions is formed. The first and second S/D regions have a first doping type, and forming the MOS transistor includes forming the first and second S/D regions in a substrate region have a second doping type different from the first doping type. In various embodiments, forming the MOS transistor includes forming an NMOS transistor or a PMOS transistor. In some embodiments, the MOS transistor is one MOS transistor of a plurality of MOS transistors, and forming the MOS transistor includes forming the plurality of MOS transistors.

In some embodiments, forming the first and second S/D regions in the substrate region includes forming S/D regions SDR in substrate region 100PS discussed above with respect to FIG. 1A. In some embodiments, forming the first and second S/D regions in the substrate region includes the substrate region being an n-well. In some embodiments, forming the first and second S/D regions in the substrate region includes forming S/D regions SDR in substrate region 100NW discussed above with respect to FIG. 1B.

Figure 5A:
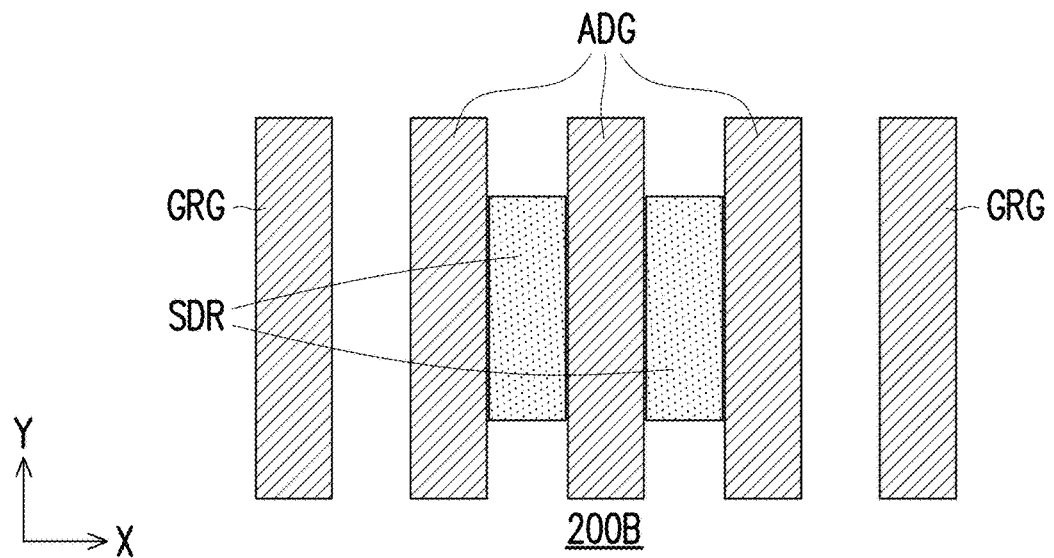
FIGS. 5A-5D are plan-view diagrams of an IC device illustrating various manufacturing procedures, in accordance with some embodiments.

In some embodiments, forming the MOS transistor including the first gate and first and second S/D regions includes forming gate ADG and S/D regions SDR in substrate region 200B, discussed above with respect to FIG. 2 and depicted in FIG. 5A. As further depicted in FIG. 5A, in some embodiments, forming gate ADG includes forming a plurality of gates ADG and GRG, discussed above with respect to FIG. 2, having a pattern configured to provide uniform loading of manufacturing equipment used to form the plurality of gates. In some embodiments, forming the plurality of gates does not include forming gate GRG.

Forming a gate, e.g., the first gate, includes performing one or more manufacturing processes suitable for forming a gate electrode and one or more dielectric layers. In some embodiments, performing the one or more manufacturing processes includes performing one or more patterning, etching, and/or deposition processes. In various embodiments, a deposition process includes a chemical vapor deposition (CVD), a plasma enhanced CVD (PECVD), an atomic layer deposition (ALD), or other process suitable for depositing one or more material layers.

In some embodiments, forming the one or more dielectric layers includes depositing one or more dielectric materials discussed above with respect to FIGS. 1A and 1B. In some embodiments, forming the gate electrode includes performing one or more deposition processes to deposit one or more conductive materials as discussed above with respect to FIGS. 1A-1B.

In some embodiments, forming a gate includes forming one or more dummy gate electrodes. In some embodiments, forming a gate includes performing replacement gate manufacturing process, e.g., a replacement high-k metal gate (RHMG) process.

Forming the first and second S/D regions includes performing one or more manufacturing processes, e.g., one or more patterning, implantation and/or deposition processes, suitable for creating volumes having lower resistivity than that of the substrate region and doping types opposite that of the substrate region. In some embodiments, forming the first and second S/D regions includes performing the one or more manufacturing processes suitable for the first and second S/D regions having the properties discussed above with respect to S/D regions SDR and FIGS. 1A and 1B.

At operation 420, a guard ring structure surrounding the MOS transistor is formed. The guard ring structure includes a second gate and first and second heavily doped regions, the first and second heavily doped regions being formed in the substrate region and having the second doping type. Forming the guard ring structure surrounding the MOS transistor includes one or both of the first or second heavily doped regions surrounding the MOS transistor.

In some embodiments, forming the first and second heavily doped regions in the substrate region includes forming heavily doped regions 100P1 and 100P2 in substrate region 100PS discussed above with respect to FIG. 1A. In some embodiments, forming the first and second heavily doped regions in the substrate region includes the substrate region being an n-well. In some embodiments, forming the first and second heavily doped regions in the substrate region includes forming heavily doped regions 100N1 and 100N2 in substrate region 100NW discussed above with respect to FIG. 1B.

Figure 5B:
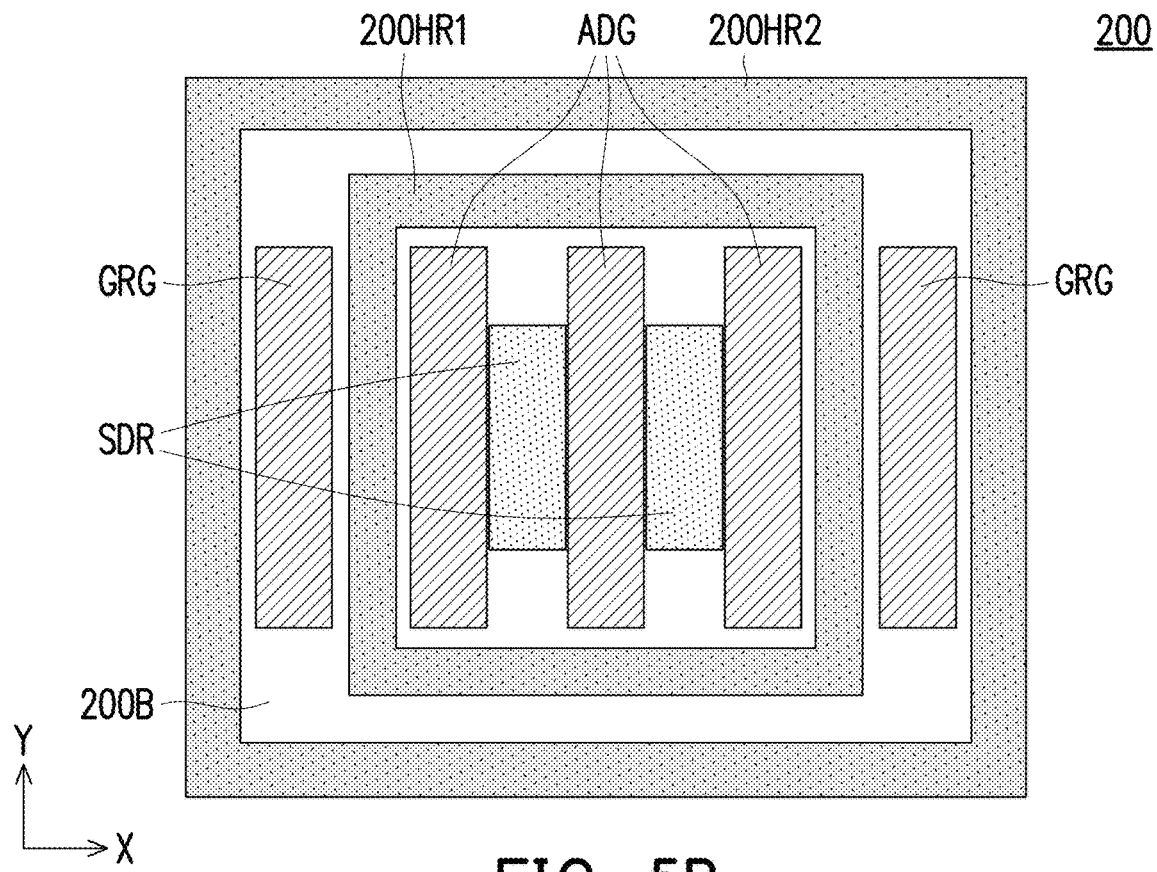

In some embodiments, forming the guard ring structure including the second gate and first and second heavily doped regions includes forming at least one gate GRG and heavily doped regions 200HR1 and 200HR2 in substrate region 200B, discussed above with respect to FIG. 2 and depicted in FIG. 5B. In some embodiments, forming gate GRG includes forming a single instance of gate GRG.

Forming the second gate includes performing the one or more manufacturing processes discussed above with respect to forming the first gate. Forming the first and second heavily doped regions includes performing the one or more manufacturing processes discussed above with respect to forming the first and second S/D regions, with the exception of the first and second heavily doped regions having the same type as that of the substrate region.

In some embodiments, the guard ring structure is one guard ring structure of a plurality of guard ring structures, and forming the guard ring structure includes forming the plurality of guard ring structures.

At operation 430, a first electrical connection is constructed between the first and second gates. Constructing the first electrical connection includes constructing one or more conductive segments, e.g., one or more vias, metal segments, electrically connected to each of the first and second gates.

Constructing an electrical connection, e.g., the first electrical connection, includes performing one or more manufacturing processes suitable for providing a low resistance path between the first and second gates. In various embodiments, performing the one or more manufacturing processes includes one or more of performing a patterning, etching, or deposition process suitable for providing a conductive material discussed above with respect to FIGS. 1A and 1B.

Figure 5C:
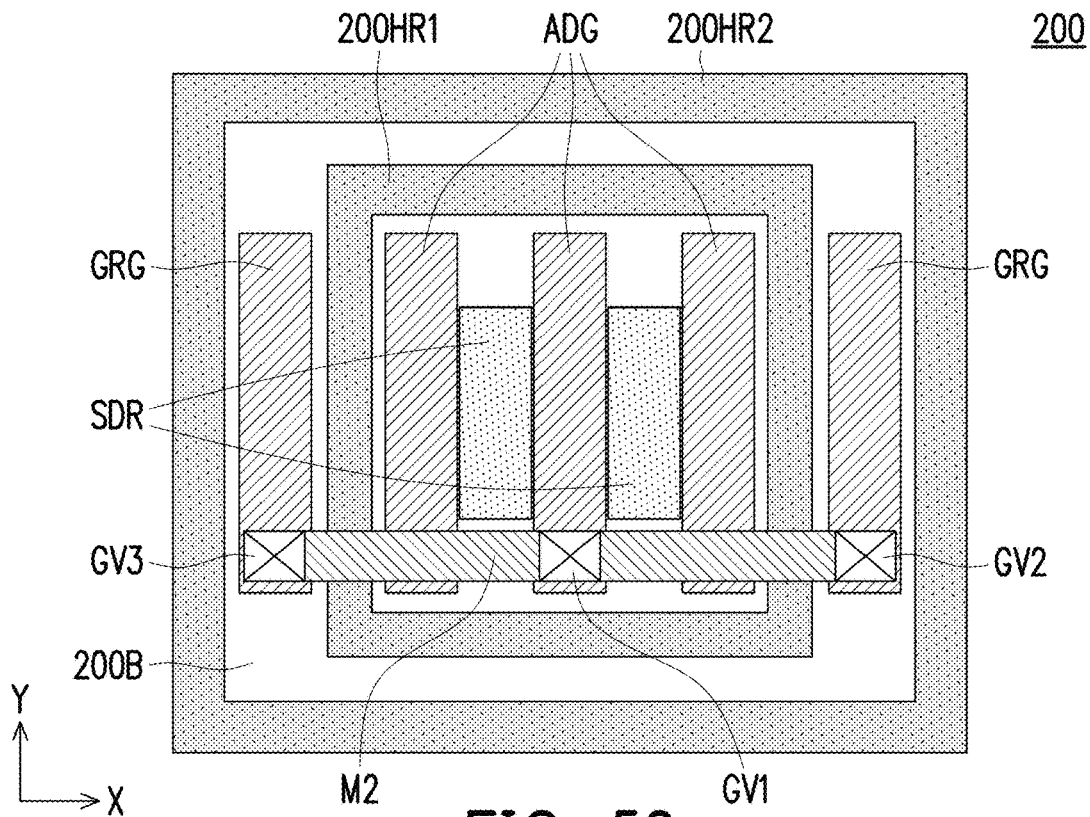

In some embodiments, constructing the first electrical connection between the first and second gates includes constructing via GV1 electrically connected to gate ADG, via GV2 electrically connected to a first instance of gate GRG, and conductive segment M2 electrically connected to each of vias GV1 and GV2, as depicted in FIG. 5C.

In some embodiments, the second gate is one gate of a plurality of gates of the guard ring structure, and constructing the first electrical connection between the first and second gates includes forming the first electrical connection between the first gate and each gate of the plurality of gates of the guard ring structure. In some embodiments, forming the first electrical connection between the first gate and each gate of the plurality of gates of the guard ring structure includes constructing via GV3 electrically connected to a second instance of gate GRG and to conductive segment M1, as depicted in FIG. 5C.

The depiction in FIG. 5C is a non-limiting example simplified for the purpose of illustration. In various embodiments, constructing the first electrical connection between the first and second gates is part of constructing an interconnection structure including multiple metal layers and capable of electrically connecting each of the first and second gates to one or more IC features (not shown) in addition to those depicted in FIG. 5C, e.g., one or more additional MOS transistors and/or one or more additional guard ring structures.

In some embodiments, constructing the first electrical connection between the first and second gates is part of constructing a decap structure including a plurality of MOS transistors and/or a plurality of guard ring structures.

At operation 440, in some embodiments, a second electrical connection is constructed between each of the first and second S/D regions and each of the first and second heavily doped regions. Constructing the second electrical connection includes constructing one or more conductive segments, e.g., one or more vias, metal segments, electrically connected to each of the first and second S/D regions and each of the first and second heavily doped regions.

Constructing the second electrical connection includes performing the one or more manufacturing processes discussed above with respect to constructing the first electrical connection.

Figure 5D:
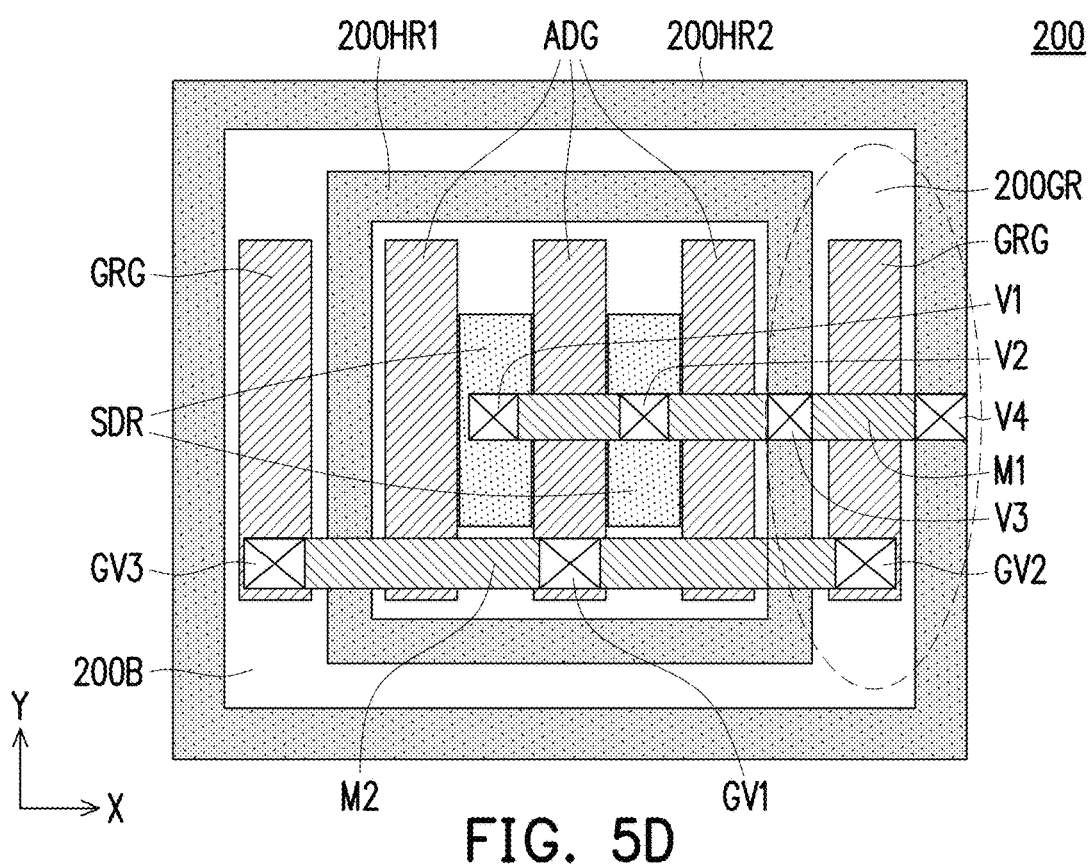

In some embodiments, constructing the second electrical connection between each of the first and second S/D regions and each of the first and second heavily doped regions includes constructing via V1 electrically connected to a first instance of S/D region SDR, via V2 electrically connected to a second instance of S/D region SDR, via V3 electrically connected to heavily doped region 200HR1, via V4 electrically connected to heavily doped region 200HR2, and conductive segment M1 electrically connected to each of vias V1, V2, V3, and V4, as depicted in FIG. 5D.

The depiction in FIG. 5D is a non-limiting example simplified for the purpose of illustration. In various embodiments, constructing the second electrical connection between each of the first and second S/D regions and each of the first and second heavily doped regions is part of constructing the interconnection structure capable of electrically connecting each of the first and second S/D regions and each of the first and second heavily doped regions to one or more IC features (not shown) in addition to those depicted in FIG. 5D, e.g., one or more additional MOS transistors and/or one or more additional guard ring structures.

In some embodiments, constructing the second electrical connection between the first and second gates is part of constructing a decap structure including a plurality of MOS transistors and/or a plurality of guard ring structures.

By executing some or all of the operations of method 400, an IC device, e.g., IC device 200, is manufactured including a guard ring structure, e.g., guard ring structure 200GR, configured as a capacitive device capable of being biased by received voltages, thereby having the benefits discussed above with respect to IC devices 100A, 100B, and 200 and method 300.

In some embodiments, a method of biasing a guard ring structure includes biasing a gate of a MOS transistor to a first bias voltage level, biasing first and second S/D regions of the MOS transistor to a power domain voltage level, each of the first and second S/D regions having a first doping type, biasing a gate of the guard ring structure to a second bias voltage level, and biasing first and second heavily doped regions of the guard ring structure to the power domain voltage level, each of the first and second heavily doped regions having a second doping type different from the first doping type, wherein each of the first and second S/D regions and the first and second heavily doped regions is positioned in a substrate region having the second doping type. In some embodiments, the first bias voltage level and the second bias voltage level are a same bias voltage level. In some embodiments, the first doping type is an n-type, the power domain voltage level is a ground voltage level, biasing the gate of the MOS transistor to the first bias voltage level includes the first bias voltage level being above the ground voltage level, and biasing the gate of the guard ring structure to the second bias voltage level includes the second bias voltage level being above the ground voltage level. In some embodiments, the first doping type is a p-type, the power domain voltage level is a supply voltage level, biasing the gate of the MOS transistor to the first bias voltage level includes the first bias voltage level being below the supply voltage level, and biasing the gate of the guard ring structure to the second bias voltage level includes the second bias voltage level being below the supply voltage level. In some embodiments, the first doping type is an n-type, the power domain voltage level is a ground voltage level, biasing the gate of the MOS transistor to the first bias voltage level includes the first bias voltage level being below the ground voltage level, and biasing the gate of the guard ring structure to the second bias voltage level includes the second bias voltage level being below the ground voltage level. In some embodiments, the first doping type is a p-type, the power domain voltage level is a supply voltage level, biasing the gate of the MOS transistor to the first bias voltage level includes the first bias voltage level being above the supply voltage level, and biasing the gate of the guard ring structure to the second bias voltage level includes the second bias voltage level being above the supply voltage level. In some embodiments, the gate of the guard ring structure is a first gate of a plurality of gates of the guard ring structure, and biasing the gate of the guard ring structure to the second bias voltage level includes biasing the plurality of gates of the guard ring structure to the second bias voltage level. In some embodiments, biasing the first and second heavily doped regions of the guard ring structure to the power domain voltage level includes biasing at least one of the first or second heavily doped regions surrounding the MOS transistor.

In some embodiments, an IC device includes a MOS transistor including first and second S/D regions, each of the first and second S/D regions having a first doping type, and a gate electrode overlying a substrate region having a second doping type different from the first doping type, and a guard ring structure including first and second heavily doped regions, each of the first and second heavily doped regions having the second doping type, and a gate electrode overlying the substrate region between the first and second heavily doped regions. Each of the gate electrode of the MOS transistor and the gate electrode of the guard ring structure is configured to receive a same bias voltage level. In some embodiments, at least one of the first or second S/D regions is electrically connected to the first and second heavily doped regions and configured to receive a power domain voltage level. In some embodiments, the first doping type is an n-type, each of the first and second S/D regions and each of the first and second heavily doped regions is configured to receive a ground voltage level, and the bias voltage level is above the ground voltage level. In some embodiments, the first doping type is a p-type, each of the first and second S/D regions and each of the first and second heavily doped regions is configured to receive a supply voltage level, and the bias voltage level is below the supply voltage level. In some embodiments, the first doping type is an n-type, each of the first and second S/D regions and each of the first and second heavily doped regions is configured to receive a ground voltage level, and the bias voltage level is below the ground voltage level. In some embodiments, the first doping type is a p-type, each of the first and second S/D regions and each of the first and second heavily doped regions is configured to receive a supply voltage level, and the bias voltage level is above the supply voltage level. In some embodiments, the gate electrode of the guard ring structure is one gate electrode of a plurality of gate electrodes of the guard ring structure overlying the substrate region between the first and second heavily doped regions. In some embodiments, at least one of the first or second heavily doped regions surrounds the MOS transistor.

In some embodiments, a method of manufacturing an IC device includes forming a MOS transistor including a first gate and first and second S/D regions, the first and second S/D regions having a first doping type and being formed in a substrate region having a second doping type different from the first doping type, forming a guard ring structure surrounding the MOS transistor, the guard ring structure including a second gate and first and second heavily doped regions, the first and second heavily doped regions being formed in the substrate region and having the second doping type, and constructing a first electrical connection between the first and second gates. In some embodiments, each of forming the first and second S/D regions in the substrate region and forming the first and second heavily doped regions in the substrate region includes the substrate region being an n-well. In some embodiments, the second gate is one gate of a plurality of gates of the guard ring structure, and constructing the first electrical connection between the first and second gates includes forming the first electrical connection between the first gate and each gate of the plurality of gates of the guard ring structure. In some embodiments, the method includes constructing a second electrical connection between each of the first and second S/D regions and each of the first and second heavily doped regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
   a metal oxide semiconductor (MOS) transistor comprising:
      first and second source/drain (S/D) regions, each of the first and second S/D regions having a first doping type; and
      a first gate electrode overlying a substrate region having a second doping type different from the first doping type; and
   a guard ring structure surrounding the MOS transistor, the guard ring structure comprising:
      first and second heavily doped regions, each of the first and second heavily doped regions having the second doping type; and
      a second gate electrode overlying the substrate region between the first and second heavily doped regions,
   wherein each of the first gate electrode and the second gate electrode is configured to receive a same bias voltage level.

2. The IC device of claim 1, wherein
at least one of the first or second S/D regions is electrically connected to the first and second heavily doped regions and configured to receive a power domain voltage level.

3. The IC device of claim 1, wherein
the first doping type is an n-type,
each of the first and second S/D regions and each of the first and second heavily doped regions is configured to receive a ground voltage level, and
the bias voltage level is above the ground voltage level.

4. The IC device of claim 1, wherein
the first doping type is a p-type,
each of the first and second S/D regions and each of the first and second heavily doped regions is configured to receive a supply voltage level, and
the bias voltage level is below the supply voltage level.

5. The IC device of claim 1, wherein
the first doping type is an n-type,
each of the first and second S/D regions and each of the first and second heavily doped regions is configured to receive a ground voltage level, and
the bias voltage level is below the ground voltage level.

6. The IC device of claim 1, wherein
the first doping type is a p-type,
each of the first and second S/D regions and each of the first and second heavily doped regions is configured to receive a supply voltage level, and
the bias voltage level is above the supply voltage level.

7. The IC device of claim 1, wherein the second gate electrode is one second gate electrode of a plurality of second gate electrodes of the guard ring structure overlying the substrate region between the first and second heavily doped regions.

8. An integrated circuit (IC) device comprising:
a metal oxide semiconductor (MOS) transistor comprising:
first and second source/drain (S/D) regions, each of the first and second S/D regions having a first doping type; and
a transistor gate electrode overlying a substrate region having a second doping type different from the first doping type; and
a guard ring structure surrounding the MOS transistor, the guard ring structure comprising:
first and second heavily doped regions, each of the first and second heavily doped regions having the second doping type; and
a guard ring gate electrode overlying the substrate region between the first and second heavily doped regions,
wherein
each of the transistor gate electrode and the guard ring gate electrode is configured to receive a same bias voltage level, and
each of the first and second S/D regions and each of the first and second heavily doped regions is configured to receive a same power domain voltage level.

9. The IC device of claim 8, wherein
the MOS transistor comprises a channel region between the transistor gate electrode and the substrate region and between the first and second S/D regions, and
the guard ring structure comprises a depletion region between the guard ring gate electrode and the substrate region and between the first and second heavily doped regions.

10. The IC device of claim 9, wherein
the first doping type is an n-type,
the power domain voltage level is a ground voltage level, and
the bias voltage level is configured to cause each of the channel and depletion regions to comprise negative charge carriers and have a depth based on a difference between the bias voltage level and the ground voltage level.

11. The IC device of claim 9, wherein
the first doping type is an n-type,
the power domain voltage level is a ground voltage level, and
the bias voltage level is configured to cause each of the channel and depletion regions to comprise positive charge carriers and have a depth based on a difference between the bias voltage level and the ground voltage level.

12. The IC device of claim 9, wherein
the first doping type is a p-type,
the power domain voltage level is a power supply voltage level, and
the bias voltage level is configured to cause each of the channel and depletion regions to comprise negative charge carriers and have a depth based on a difference between the bias voltage level and the power supply voltage level.

13. The IC device of claim 9, wherein
the first doping type is a p-type,
the power domain voltage level is a power supply voltage level, and
the bias voltage level is configured to cause each of the channel and depletion regions to comprise positive charge carriers and have a depth based on a difference between the bias voltage level and the power supply voltage level.

14. An integrated circuit (IC) device comprising:
a metal oxide semiconductor (MOS) transistor comprising:
first and second source/drain (S/D) regions, each of the first and second S/D regions having a first doping type; and
a transistor gate electrode overlying a substrate region having a second doping type different from the first doping type; and
a guard ring structure comprising:
first and second heavily doped regions, each of the first and second heavily doped regions having the second doping type; and
a guard ring gate electrode overlying the substrate region between the first and second heavily doped regions,
wherein
each of the transistor gate electrode and the guard ring gate electrode is configured to receive a same bias voltage level, and
each of the first and second heavily doped regions surrounds the MOS transistor.

15. The IC device of claim 14, further comprising:
a first metal segment overlying and electrically connected to each of the first and second S/D regions and each of the first and second heavily doped regions, the first metal segment being configured to have a power domain voltage level; and
a second metal segment overlying and electrically connected to each of the transistor gate electrode and the guard ring gate electrode.

16. The IC device of claim 15, wherein
the first doping type is an n-type,
the power domain voltage level is a ground voltage level, and
the second metal segment is configured to have a bias voltage level different from the ground voltage level.

17. The IC device of claim 15, wherein
the first doping type is a p-type,
the power domain voltage level is a power supply voltage level, and
the second metal segment is configured to have a bias voltage level different from the power supply voltage level.

18. The IC device of claim 15, wherein
the guard ring gate electrode is one guard ring gate electrode of a plurality of guard ring gate electrodes, and
the IC device comprises a third metal segment configured to have the power domain voltage level.

19. The IC device of claim 14, wherein
the MOS transistor is one MOS transistor of a plurality of MOS transistors, and
each of the first and second heavily doped regions surrounds the plurality of MOS transistors.

20. The IC device of claim 1, further comprising:
a metal segment overlying and electrically connected to each of the first and second gate electrodes, wherein the metal segment is configured to receive the bias voltage level.

* * * * *